United States Patent

Chi

[11] Patent Number: 5,854,100
[45] Date of Patent: Dec. 29, 1998

[54] METHOD OF FORMING A NEW BIPOLAR/CMOS PIXEL FOR HIGH RESOLUTION IMAGERS

[75] Inventor: Min-Hwa Chi, Hsinchu, Taiwan

[73] Assignee: Vanguard International Semiconductor Corporation, Hsin-Chu, Taiwan

[21] Appl. No.: 968,155

[22] Filed: Nov. 17, 1997

[51] Int. Cl.[6] .............................................. H01L 21/8238
[52] U.S. Cl. ........................... 438/202; 438/234; 438/57; 438/59
[58] Field of Search ................................... 438/202, 234, 438/57, 59, 73; 257/290, 293

[56] References Cited

U.S. PATENT DOCUMENTS

| | | |
|---|---|---|
| 4,682,203 | 7/1987 | Konda . |
| 4,791,070 | 12/1988 | Hirao et al. ................................ 438/59 |
| 5,097,305 | 3/1992 | Mead et al. ................................... 35/30 |
| 5,245,203 | 9/1993 | Morishita et al. ....................... 257/113 |
| 5,260,592 | 11/1993 | Mead et al. .............................. 257/291 |
| 5,288,988 | 2/1994 | Hashimoto et al. .................. 250/208.1 |
| 5,324,958 | 6/1994 | Mead et al. .............................. 257/291 |
| 5,506,152 | 4/1996 | Whitney ...................................... 438/59 |
| 5,566,044 | 10/1996 | Bergemont et al. .................. 361/321.1 |
| 5,726,439 | 3/1998 | Miyawaki et al. .................... 250/208.1 |

OTHER PUBLICATIONS

"A High Resolution CMOS Imager with Activel Pixel Using Capacitively Coupled BiPolar Operation" Chi et al, paper #82, Proceedings of International Conf. on VLSI–Technology Systems & Applications, Taiwan, Jun. 1997.

Fossum, "Image Capture Circuits in CMOS", Paper #B1, Proceedings fo International Conf on VLSI–Technology, Systems & Applications, Tapei, Taiwan, Jun. 1997.

*Primary Examiner*—Tuan H. Nguyen
*Attorney, Agent, or Firm*—George O. Saile; Stephen B. Ackerman; Billy Knowles

[57] ABSTRACT

An active pixel sensor cell that will convert a quantum of light energy to an electronic signal representing the amplitude of the quantum of light energy is disclosed. The active pixel sensor cell is immune to image blooming and has a reset operation to reduce image lag. An active pixel sensor has a photodiode, a bipolar transistor and a MOS transistor. The photodiode has a cathode connected to a power supply voltage source and an anode to the MOS transistor. The quantum of light energy will impinge upon the anode and generate electric charges within the photodiode. The MOS transistor will prevent the image blooming by disconnecting the anode of the photodiode from the base of the bipolar transistor and connecting the anode of the photodiode to MOS transistor to allow the electric charges in the photodiode to flow through the MOS transistor. The bipolar transistor will amplify the electrical charges to create the electronic signal. The active pixel sensor further includes a parasitic MOS transistor. The drain of the parasitic MOS transistor is the anode of the photodiode, the source is the anode of the photodiode of an adjacent active pixel sensors of a row of active pixel sensors within an array of active pixel sensors. When the parasitic MOS transistor is turned on by a reset circuit, it will reset the anode of the photodiode to the same level as that of other photodiodes in a row to reduce image lag on the active pixel sensor.

5 Claims, 10 Drawing Sheets

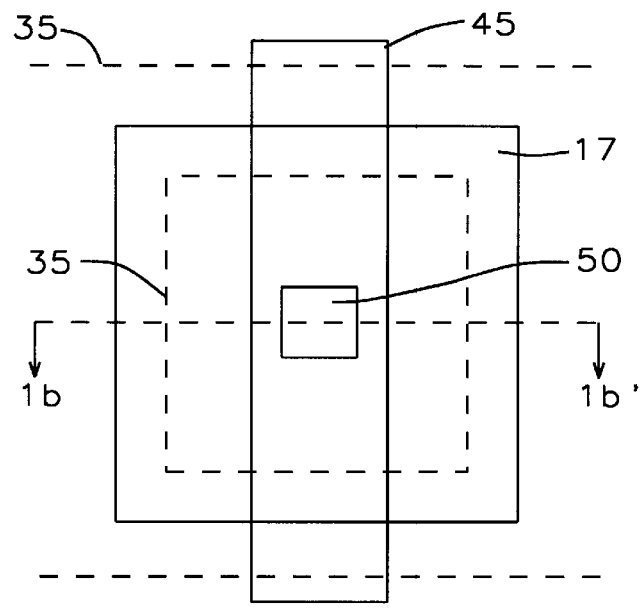
FIG. 1a – Prior Art
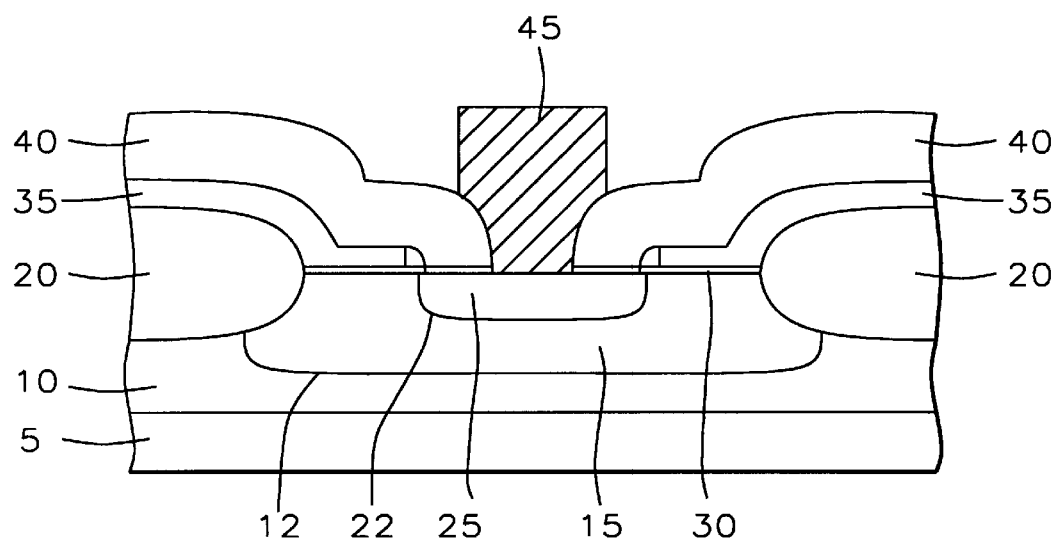
FIG. 1b – Prior Art

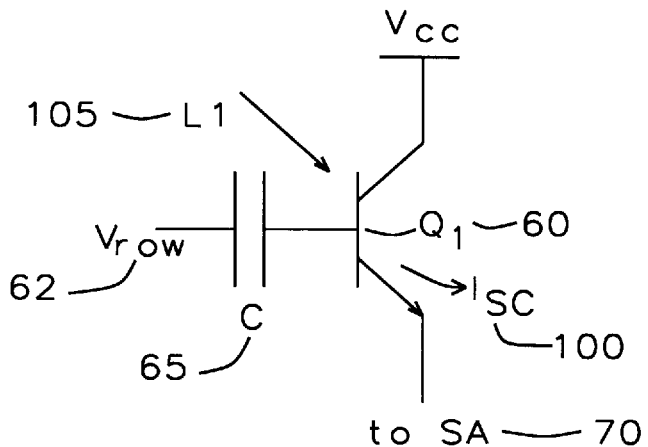
*FIG. 1c — Prior Art*
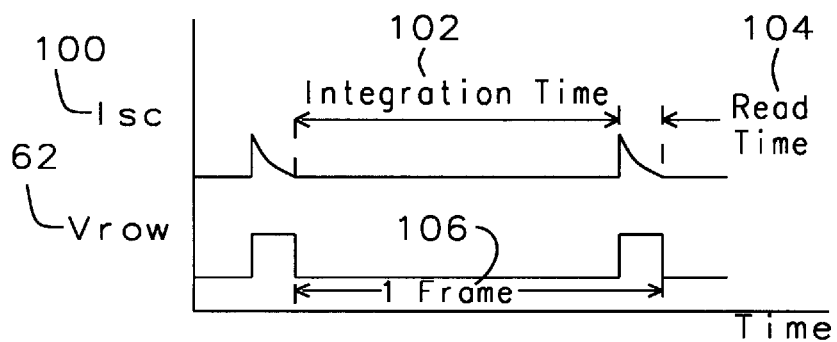
*FIG. 1d — Prior Art*

METHOD OF FORMING A NEW BIPOLAR/ CMOS PIXEL FOR HIGH RESOLUTION IMAGERS

BACKGROUND OF THE INVENTION

1. Field of the Invention

This invention relates to circuits and semiconductor devices that will receive light and convert the light to an electronic signal representing the amplitude of the light. More particularly this invention relates to circuits and semiconductor devices that will eliminate blooming caused by charge overflow and image lag caused by residual charges in the devices.

2. Description of the Related Art

Imaging circuit typically include a two dimensional array of photosensors. Each photosensor will comprise one picture element (pixel) of the image. Light energy emitted or reflected from an object will impinge upon the array of photosensors. The light energy will be converted by the photosensors to an electrical signal. Imaging circuitry will scan the individual photosensors to readout the electrical signals. The electrical signals of the image will be processed by external circuitry for subsequent display.

The most common single chip imaging technology in use is the charge coupled device (CCD) camera. A CCD operates by accumulating charge generated within a photo sensor in potential wells in the semiconductor substrate. The depth of the potential wells is controlled by the voltage on a gate electrode located just above the surface of the semiconductor substrate. By manipulating the voltage on the gate electrodes, the charges can be moved along the surface of the semiconductor substrate to a sensing point. The charges will be amplified into the electronic signals of the image.

Modern metal oxide semiconductor (MOS) processing techniques have allowed the transport of charges within CCD structures to be accomplished with almost perfect efficiency at video rates. However, some fraction of the charge accumulated will be lost during the shifting of is the charge along the surface. The charge accumulated within each potential well will be shifted and sensed once per frame time. Typically this time is on the order of 30–60 frames per second.

The CCD technology has limitations. The charge generated by the impinging light is shifted directly before being sensed and amplified. Because of the inefficiency of this process, the gain of the device (electrons out vs. photons in) is less than unity. The will impose limitations on the amount of charge to be stored in each well. The amount of minimum charge will be the amount that can be sensed in the sense amplifier above the noise of the sense amplifier. The amount of maximum charge will be limited by the amount that will physically be able to be generated and shifted from one well to the next.

To overcome these dynamic-range limitations of the CCD, a phototransistor has been used to sense the incoming light. High resolution imagers as described in U.S. Pat. 5,260,592 (Mead et al.), U.S. Pat. 5,324,958 (Mead et al.), and "A High Resolution CMOS Imager With Active Pixel Using Capacitively Coupled BiPolar Operation", Chi et al, paper #82, Proceedings of International Conference on VLSI—technology, systems, and applications, Taipei, Taiwan, June 1997, have a simple structure as shown in FIGS. 1a, 1b, and 1c. These pixel structures employ standard processing techniques typical to CMOS logic technology.

A N-type impurity is implanted in a P-substrate 5 to form an N-well 10. A field oxide 20 is grown on the surface of the semiconductor substrate to define the boundaries of the pixel cell. Within the field oxide 20 a p-type impurity is implanted to form the P-base 15 of the phototransistor Q1 60. The N-well 10 will be connected to a power supply voltage source and act as the collector of the phototransistor Q1 60. Next a thin layer of gate oxide is grown on the surface of the P-base 15 to form the capacitor dielectric 30 of the capacitor C 65. A layer of polysilicon material 35 will be deposited over the P-base 15 to form the second plate of the capacitor C 65. After a shore re-oxidation and formation of oxide spacer an n-type impurity is implanted to for the emitter 25 of the phototransistor Q1 60. The P-base 15 is left floating. Its potential is determined by the $V_{row}$ the coupling of capacitor C 65. The layer of polysilicon material will also be connected to the row activation voltage circuit $V_{row}$ 62. The row activation circuit $V_{row}$ 62 will activate the phototransistor Q1 60 to transfer charges collected by the phototransistor Q1 60.

A second insulating material such as silicon dioxide is deposited on the surface of the semiconductor substrate to form the dielectric 40. A metal layer 45 is place in contact 50 with the emitter 25 of the bipolar transistor Q1 60. The metal layer 45 will provide the interconnection to the sense amplifier 70. It is apparent that the above described process flow can be used to form CMOS transistors. For instance the polysilicon material 35 can be used to form a gate of the CMOS transistor and the n-type implant that is used to form the emitter 25 can be used to form a source/drain region. The compatibility of fabricating bipolar pixels and CMOS transistors is a great advantage compared to the process used in CCD fabrication methods.

A quantum of light energy L1 105 will be reflected or emitted from an external object and impinge upon the P-base active region 17. The photons of the quantum of light energy 105 will be absorbed in the neighborhood of the collector-base junction 12 and the emitter base junction 22 and form electron-hole pairs. The electron-hole pairs will be collected by the nearest p-n junction. The minority carriers collected by either the collector-base junction 12 or the emitter-base junction 22 will as base current. The base current is multiplied by the current gain of the transistor to form the collector current. The signal current $I_{sc}$ 100 at the emitter 25 of the transistor Q1 60 is the sum of the base current created by the conversion of the quantum of light 105 to the electron-hole pairs and the collector current. The signal current $I_{sc}$ 100 will be transferred to the sense amplifier 70 for further conditioning.

Refer now additionally to Fig. 1d to understand the operation of the photo transistor pixel structure. During the integration period 102 the row activation circuit $V_{row}$ 62 is held at a fixed voltage to reverse bias the base-emitter junction 22 of the transistor Q1 60. Under this condition, the current created by the conversion of the quantum of light 105 to the electron-hole pairs will integrate on the capacitor C 65.

When it is desired to read the amount of charge created during the integration period 107, the row activation circuit $V_{row}$ 62 is brought to a high voltage level during the read time 104. The P-base potential is raised by Vrow 62 through capacitor C 65 coupling becomes forward biased with respect to the emitter 25. The charge on capacitor C 65 will flow in the base 15 of the transistor Q1 60 and form the emitter current which is the signal current $I_s$ 100.

Other structures incorporating photodiodes and MOS transistors are described in "Image Capture Circuits in CMOS" E. Fossum, Paper #B1, Proceedings of International Conference on VLSI—Technology, Systems, and Applications, Taipei, Taiwan, June 1997. A passive pixel circuit consists of a photodiode and a MOS pass transistors. The photodiode will convert light to electric charge. The MOS pass transistor will gate the electric charge to a charge integrating amplifier. An active pixel circuit will have a photodiode, a MOS pass transistor, and a source follower to act as a buffer amplifier to the charge integrating amplifier. A MOS transistor activated by a reset signal is added to the active pixel circuit to reset the photodiode to act as an electronic shutter.

The active bipolar pixel of FIGS. 1a, 1b, and 1c have the advantage of high sensitivity, simpler pixel layout, and lower manufacturing cost compared to CMOS pixels as described in Chi. However, the bipolar active pixels have the limitations of blooming and image lag.

Refer now to FIG. 2 to understand the phenomena of blooming. In an array of pixels (pixel A 80–pixel X 85), one row of pixels—pixel A 80 will be integrating the charge from the quantum of light L1 105 impinging on the phototransistor Q1 60a. That is the row activation circuit $V^{rowa}$ will be brought to a low level 75 to reverse bias the base emitter junction of the phototransistor Q1 60a and allow the charges to collect at the capacitor C 65a. At this same time another row of pixels—pixel X 85 will be read to sense the level of charge present on the capacitor C 65b.

If the quantum of light impinging L1 105 on the pixel A 80 is sufficiently large, the charges will begin to forward bias the base-emitter junction of the transistor Q1 60a. This will cause an overflow current $I_{ofc}$ 95 to flow in the column interconnection 90. The sense amplifier will now sense the total current $I_{tot}$ 110 which is the sum of the overflow current $I_{ofc}$ 95 and the intended signal current $I_{sc}$ 100. The pixel being read (pixel X 85) will to be brighter than is should be. This will cause a blooming of bright light sources within an image.

Refer now to FIG. 3 to understand the problem of image lag. In this diagram the pixel X—last frame 200 will have been read at the frame time previous to the current frame time. As the row activation circuit $V_{rowx}$ is brought from a high voltage to a low voltage 185, the p-base is reversed biased with respect to the emitter by the coupling of the capacitor C 165. The p-base potential may not be the same for all pixels with the row at the beginning of the image integration time. The amount of P-base potential drop after $V_{row}$ transitions from a high level to a low level (i.e. pulse height) at the beginning of a read operation is:

$\Delta V_B$=(Pulse height)×(coupling ratio).

The coupling ratio of the capacitor C 165 is defined as:

$$\lambda = \frac{C}{C + C_{BE} + C_{BC}}$$

where:
$C_{BE}$ is the base-emitter junction capacitance of the transistor Q1 160.
$C_{BC}$ is the base-collector junction capacitance of the transistor Q1 160.
The P-base potential is controlled by the voltage $V_{row}$ and the coupling ratio ($\gamma$). Thus the charge removal from the capacitor C 165 is not complete and will cause a component of a residue current 210 in the emitter of the transistor Q1 160.

A second component of the residue current 210 will be a remnant of minority carrier charges left in the p-base from the injection of electrons from the forward biased base-emitter junction of the transistor Q1 160 during the previous read operation. The residue charges in the p-base will continuously flow with current gain to the emitter of the transistor Q1 160 and will be added to the signal current 215 of the current read time. This will cause a ghosting of the image following moving objects or a tail following a bright object. The residual charge will eventually disappear some time later by either recombination or the minority carrier current flowing away from the P-base. The time for image lag is approximately the minority carrier recombination lifetime (i.e. approximately 100 msec.) and can last for several frames.

An impurity could be added to the p-base to act as an "life-time killer" to reduce the recombination time. A difficulty with such "life-time killers" is increased junction leakage current, which degrades the imager sensitivity.

U.S. Pat. 5,097,305 (Mead et al.) discloses a photosensor having a phototransistor and a capacitor coupled to the base of the phototransistor. A pass transistor is placed in the emitter of the phototransistor to selectively couple the signal current to the sense amplifier.

U.S. Pat. 5,288,988 (Hashimoto et al.) describes a photosensor circuit similar to that described in FIGS. 1a, 1b, and 1c. The cell incorporates a MOS transistor in the photoconversion cell. When the MOS transistor is activated, the above described residue current will be prevented by eliminating the residue charges from the base of the phototransistor.

SUMMERY OF THE INVENTION

An object of this invention is to create an active pixel sensor cell to convert a quantum of light energy to an electronic signal representing the amplitude of the quantum of light energy.

Another object of this invention is to create an active pixel sensor cell that is immune to image blooming.

Further another object of this invention is to create an active pixel sensor cell that can reduce residual charge for minimum image lag.

To accomplish these and other objects an active pixel sensor has a photodiode, a bipolar transistor and a MOS transistor. The photodiode has a cathode connected to a power supply voltage source and an anode. A quantum of light energy will impinge upon the upon the anode and generate electric charges within the photodiode. The MOS transistor will prevent the image blooming. The MOS transistor has a drain connected to the anode of the photodiode, a source, and a gate. The gate is connected to a sensor control circuit which will selectively activate and deactivate the MOS transistor to prevent or allow the electric charges to flow through the MOS transistor The bipolar transistor will amplify the electrical charges to create the electronic signal. The bipolar transistor has a collector connected to the power supply voltage source, a base connected to the source of the MOS transistor to receive the electric charges when the MOS transistor is activated, and an emitter connected to external circuitry to transfer the electronic signal to the external circuitry.

The active pixel sensor further includes a parasitic MOS transistor. The parasitic MOS transistor has a drain that is the anode of the photodiode, a source that is the anode of the photodiode of an adjacent active pixel sensors of a row of active pixel sensors within an array of active pixel sensors. The parasitic MOS transistor has a gate connected to a reset circuit that will turn on the parasitic MOS transistor to reset the potential of the anode of the photodiode in a row to the same potential level so that the image lag contributed from uneven anode potential after reset is eliminated on the active pixel sensor.

BRIEF DESCRIPTION OF THE DRAWINGS

FIG. 1a and 1b are a top view and a cross sectional view of a semiconductor substrate showing a photosensor cell of the prior art.

FIG. 1c is a schematic diagram of the photosensor cell of the prior art shown in FIGS. 1a and 1b.

FIG. 1d is a timing diagram of the photosensor cell of the prior art shown in FIGS. 1a and 1b.

DETAILED DESCRIPTION OF THE INVENTION

Figure 4A:
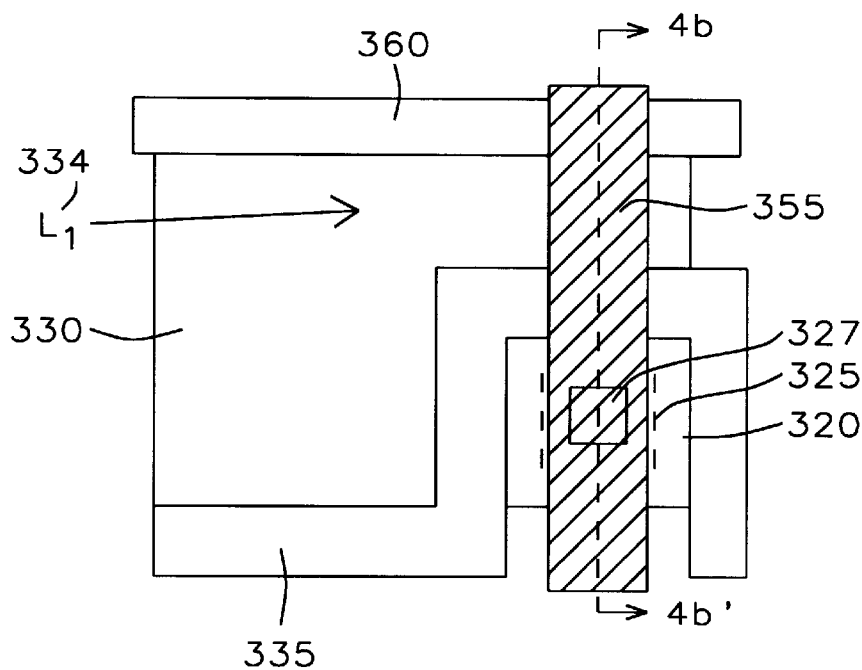
FIGS. 4a and 4b are a top view and a cross sectional view of a semiconductor substrate showing an active pixel sensor of this invention shown in FIG. 4a and 4b.
Figure 4B:
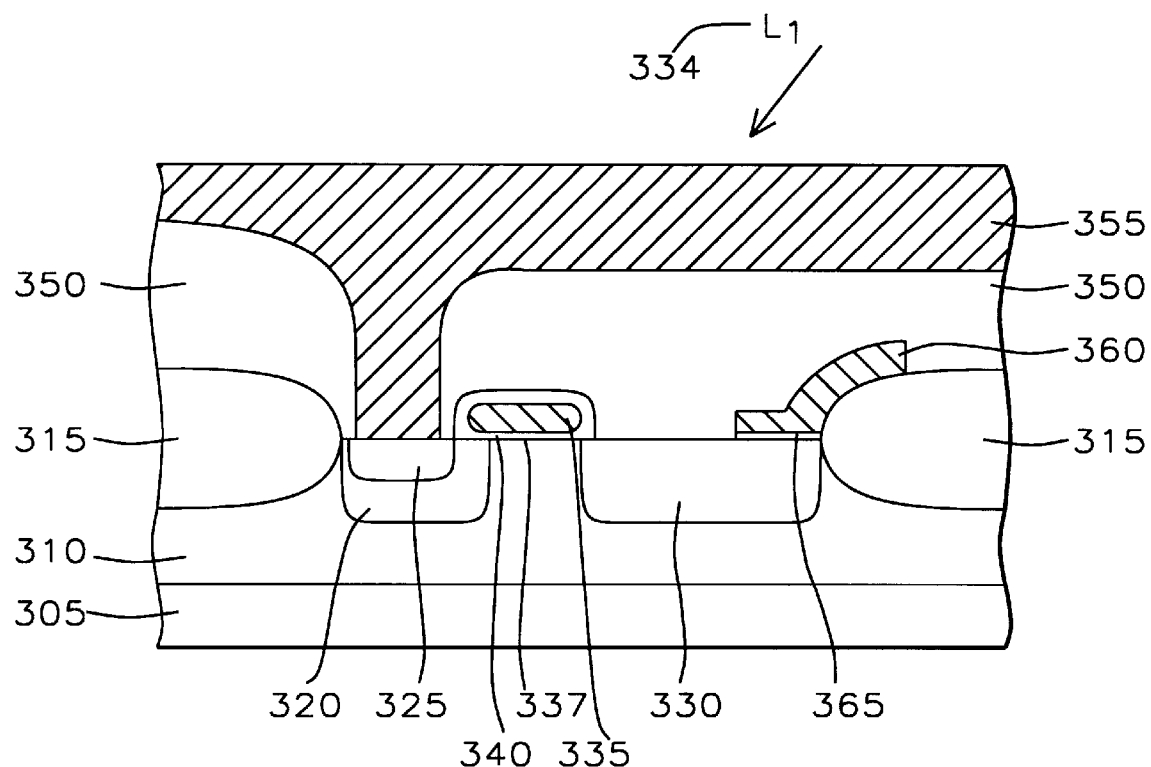
Figure 4C:
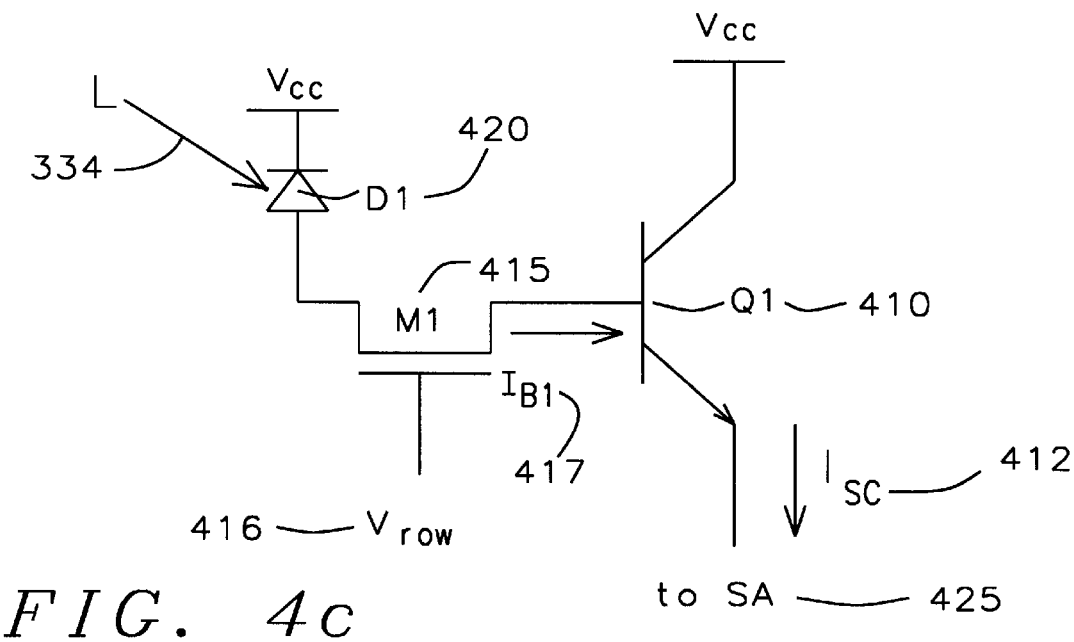
FIG. 4c is a schematic diagram of an active pixel sensor cell of this invention shown in FIG. 4a and 4b.

Refer now to FIGS. 4a, 4b, and 4c to understand the structure of the active pixel sensor of this invention. The fabrication of the device starts from a typical P-type substrate 305 of a silicon wafer. The surface of the P-substrate 305 will then be masked and an N-type impurity will be implanted to form the N-well 310. An isolation region or field oxide 315 is grown to delineate the area of the active pixel cell. Within the area of the active pixel sensor cell is masked to define the P-anode 330 of the photodiode D1 420. A P-type impurity is implanted to form the P-anode 330. The N-well will be placed in contact with a power supply voltage source $V_{cc}$ and function as the cathode of the photodiode D1 420.

A second area within the area of the active pixel sensor cell will be masked to delineate the P-base 320 of the bipolar transistor Q1 410. A P-type impurity will be implanted to form the P-base 320. A third area within the P-base 320 is then masked and implanted with an N-type impurity to form the emitter 325 of the bipolar transistor Q1 420. The collector of the bipolar transistor Q1 420 will be the N-well 310.

The P-base 320 of the bipolar transistor Q1 410 and the P-anode 330 of the photodiode D1 420 respectively form the drain and source of the MOS transistor M1 415. A gate oxide 340 will be grown above the channel region 337 between the source 320 and the drain 330. On the gate oxide 340 a polysilicon material 335 will be deposited and etched to form a gate for the MOS transistor M1 315.

An insulating material will be deposited on the surface of the semiconductor substrate to form the dielectric 350. A contact 327 to the N+emitter 325 is formed in an opening in the dielectric 350. A metal layer 355 is deposited to connect the emitter 325 of transistor M1 410 to a sense amplifier 425 that is in circuitry external to the array of active pixel sensors. The polysilicon material 335 that forms the gate of the MOS transistor M1 415 will be the connection to the row activation circuit $V_{row}$ 416 that is a function of the sensor control circuitry. It will be again be apparent, that the above described process flow can be used to form CMOS transistors. For instance the polysilicon material 335 can be used to form a gate of the CMOS transistor and the n-type implant that is used to form the emitter 325 can be used to form a source/drain region. The compatibility of fabricating bipolar pixels and CMOS transistors is a great advantage compared to the process used in CCD fabrication methods.

Figure 4D:
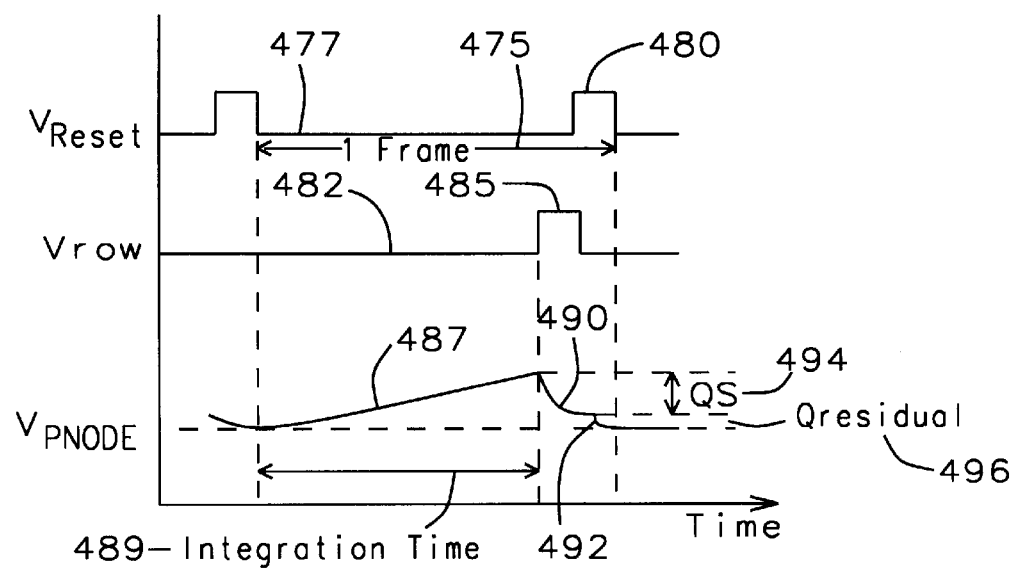
FIG. 4d is a timing diagram of an active pixel sensor cell of this invention.

Refer now additionally to FIG. 4d to understand the operation of the active pixel sensor cell. A quantum of light L 334 will impinge upon the P-anode 330 of the diode D1 420. The quantum of light L 334 will impart sufficient energy as to create electron-hole pairs similar to that above described for the phototransistor Q1 60 of the FIGS. 1a, 1b, and 1c. The holes will migrate to the side of the P-anode 330 of the photodiode D1 420. The electrons will be collected at the cathode (the N-well 310) of the photodiode D1 420 and removed through the power supply voltage source Vcc. This positive charge accumulation of holes in the P-anode 330 of the photodiode D1 420 is shown as the increase in potential 487. The row activation circuit $V_{row}$ 415 will be brought from a high voltage level a low voltage level thus turning on the P MOS transistor Ml 415. The charge $Q_s$, 494 generated from the quantum of light L 334 (the image) as represented by the P-anode potential $V_{P\text{-}anode}$ will flow into the P-base 320 of the transistor Q1 410 forming the base current $I_{B1}$ 417. The base current $I_{B1}$ 417 will be amplified by the transistor Q1 410 and form the signal current $I_{sc}$ 412. After sensing the signal current, the row activation circuit $V_{row}$ 416 has its voltage returned to the low voltage level 485, there will be a residual charge $Q_{residual}$ 496 remaining in the P-base 320 of the photodiode D1 420. The P-anode 330 of the photodiode D1 420 is then reset to a voltage level by the operation of reset as described hereinafter.

Figure 5:
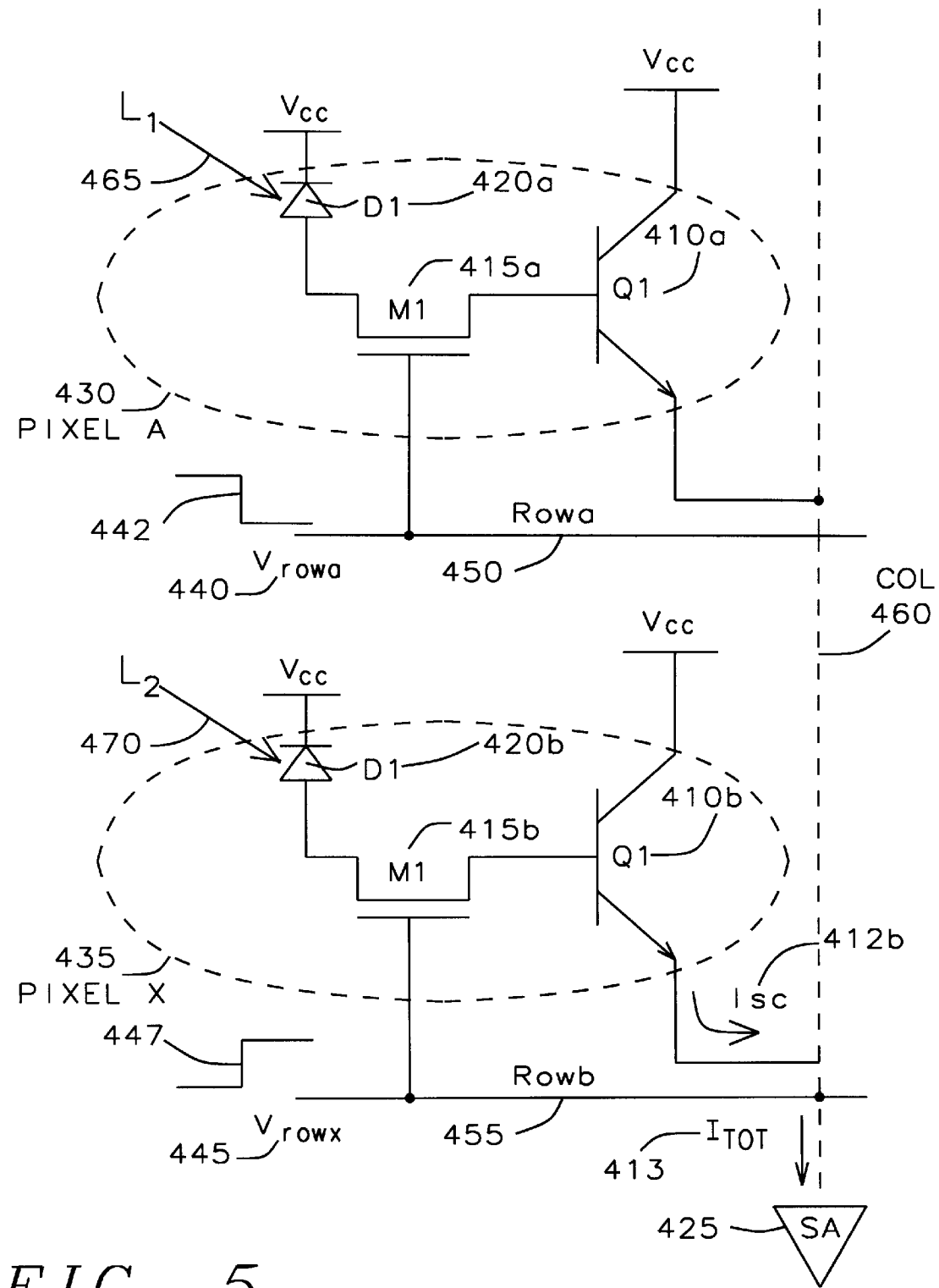
FIG. 5 is a schematic diagram of two cells of an array of active pixel sensor cells of this invention illustrating the elimination of overflow currents.

Refer first to FIG. 5 to understand the operation of the active pixel sensor of this invention to prevent blooming of the pixel image. Pixel A 430 and Pixel X 435 are two active pixel sensors of an array of active pixels sensors that are arranged in rows and columns. Pixel A 430 and Pixel X 435 will be connected commonly to the column 460 and to the common sense amplifier 426.

The control of the activation of Pixel A 430 will be by row activation circuit $V_{rowa}$ 450 through the interconnection Row a 450 and the control of the activation of Pixel X 435 will be by row activation circuit $V_{rowx}$ 445 through the interconnection Row x 455. When the row activation circuit $V_{rowa}$ 450 is brought to a high value 442, the pixel A 430 will be in the integration time 489. At this time if the charge accumulated by the quantum of light L2 470 by the photodiode D1 420b of the pixel X 435 is to be read, the row activation circuit $V_{rowx}$ 445 will be brought to a low voltage level 447 to turn on the P-MOS transistor M1 415b. The signal current $I_{sc}$ 412b will flow from the emitter of the transistor Q1 410b of the pixel X 435.

Figure 2:
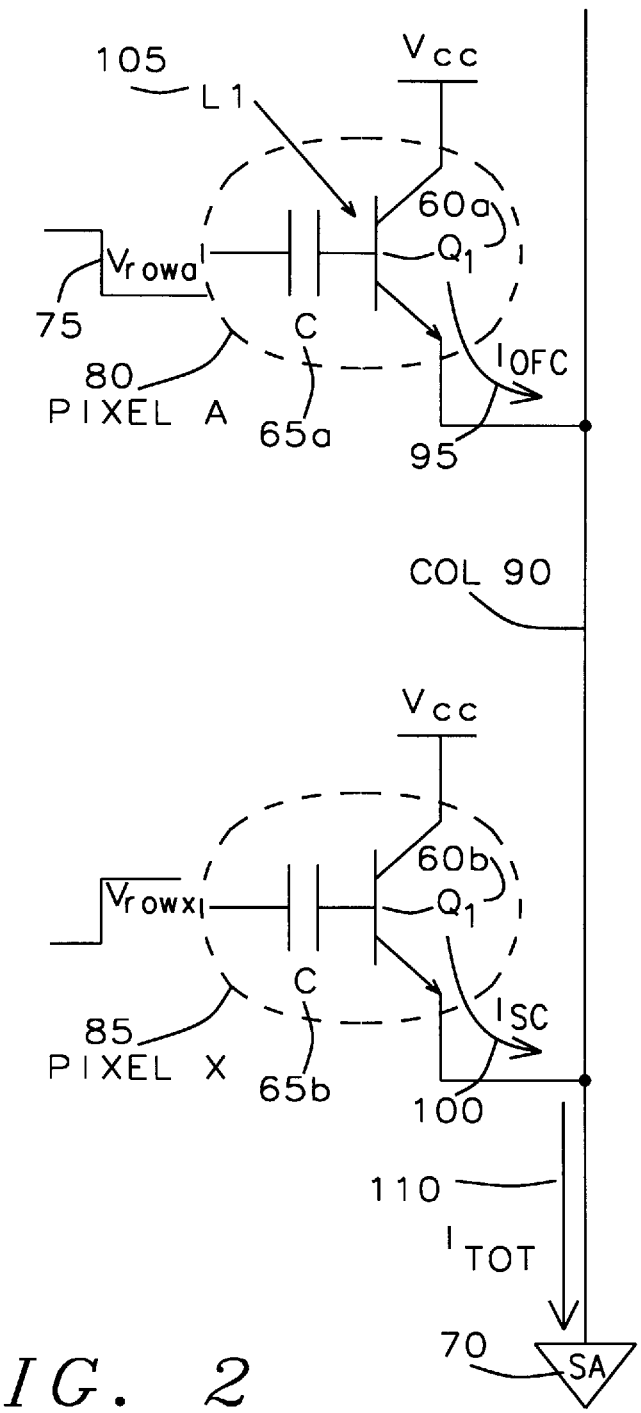
FIG. 2 is a schematic drawing of two cells of an array of photosensor cells of the prior art illustrating the overflow currents that cause image blooming.
Figure 3:
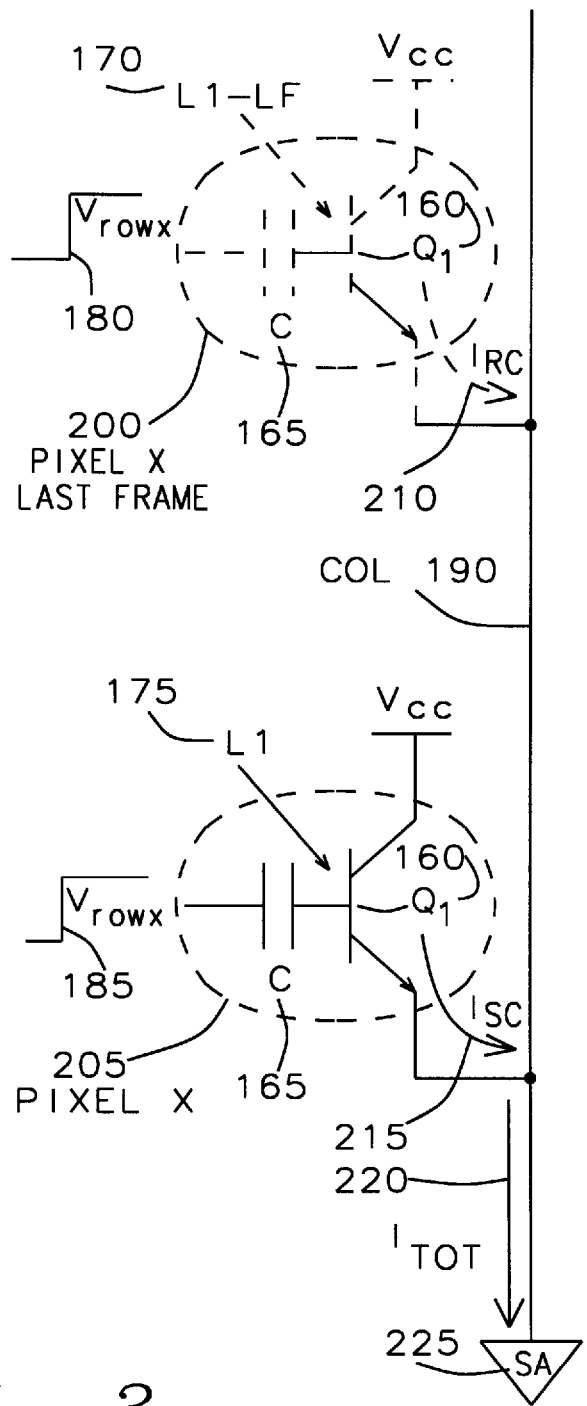
FIG. 3 is a schematic drawing of a cell of an array of photosensor cells of the prior art illustrating the residue current that causes image lag.

Even if the quantum of light L1 465 impinging on the photodiode D1 420a is excessively strong, there will be no overflow current $1_{ofc}$ 95 of FIG. 2. The P-MOS transistor M1 415a will be deactivated and no current can flow to the transistor Q1 410a. Under excessively strong light L1 465, holes accumulated at the P-anode raise the potential of the P-anode rapidly until the photodiode is slightly forward biased and an "overflow current" is flowing into the power supply voltage source $V_{cc}$ of the cathode of the photodiode Thus the total current $I_{tot}$ 413 will have not extraneous component and consist only of the signal current $I_{sc}$ 412b. This will prevent blooming of the image since the sense amplifier 425 will receive only the appropriate magnitude of current.

The understand the reset operation refer back to FIGS. 4a, 4b, 4c, and 4d. A second polysilicon material 360 is deposited over a layer of insulating material 365 that is formed when the gate oxide 340 is grown. This reset polysilicon 360 will be connected to a reset circuit $V_{reset}$. The reset circuit $V_{reset}$ will apply a low voltage level 480 to the reset polysilicon 360 so that parasitic P-MOS transistors formed by adjacent active pixel sensors will be on and the potential of all the P-anode 330 will be reset to the same level. Details of the parasitic P-MOS transistor and reset operation are described next in FIG. 6a, 6b, and 6c.

Figure 6A:
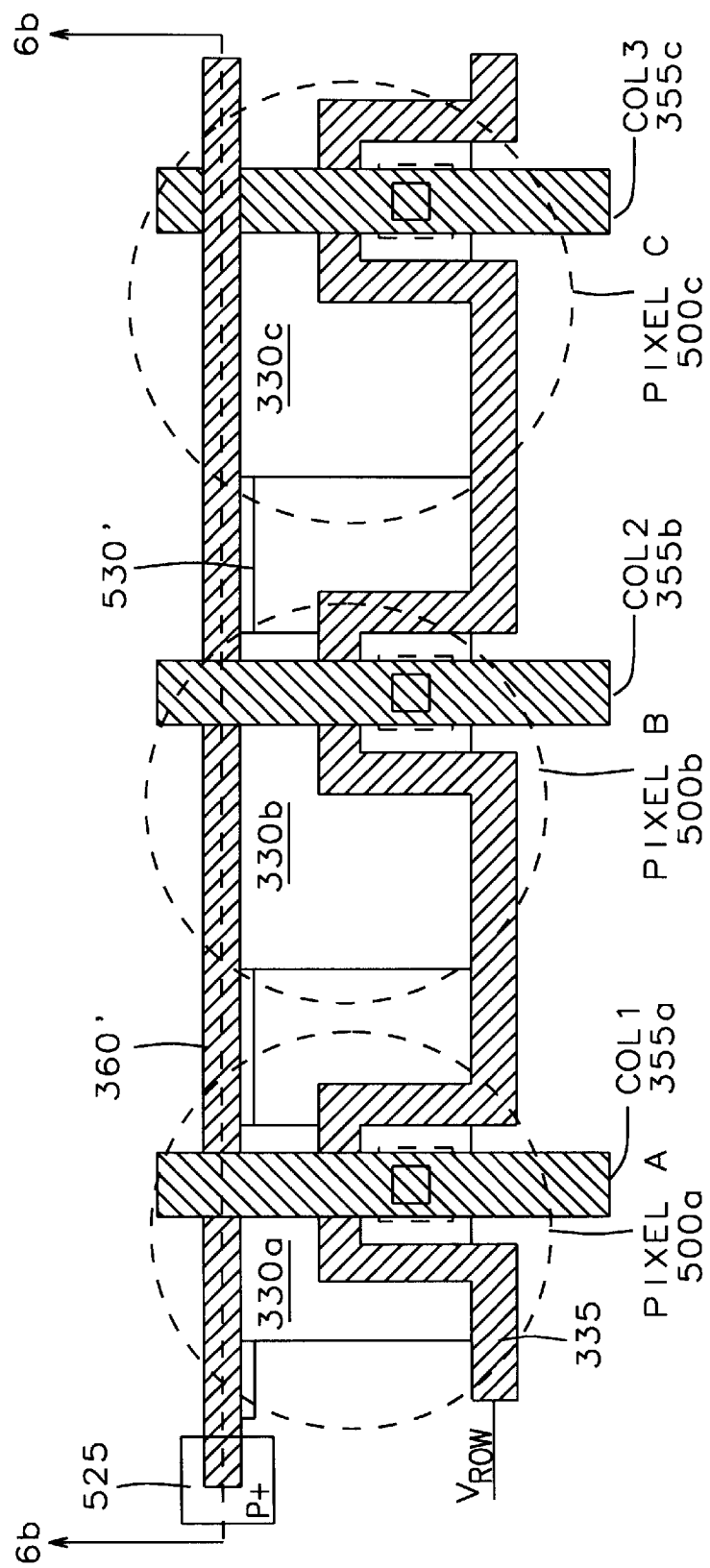
FIGS. 6a, 6b, and 6c show a top view, a cross sectional view, and a schematic diagram of three cells of an array of active pixel sensor cells of this invention illustrating the photodiode reset operation to minimize image lag.
Figure 6B:
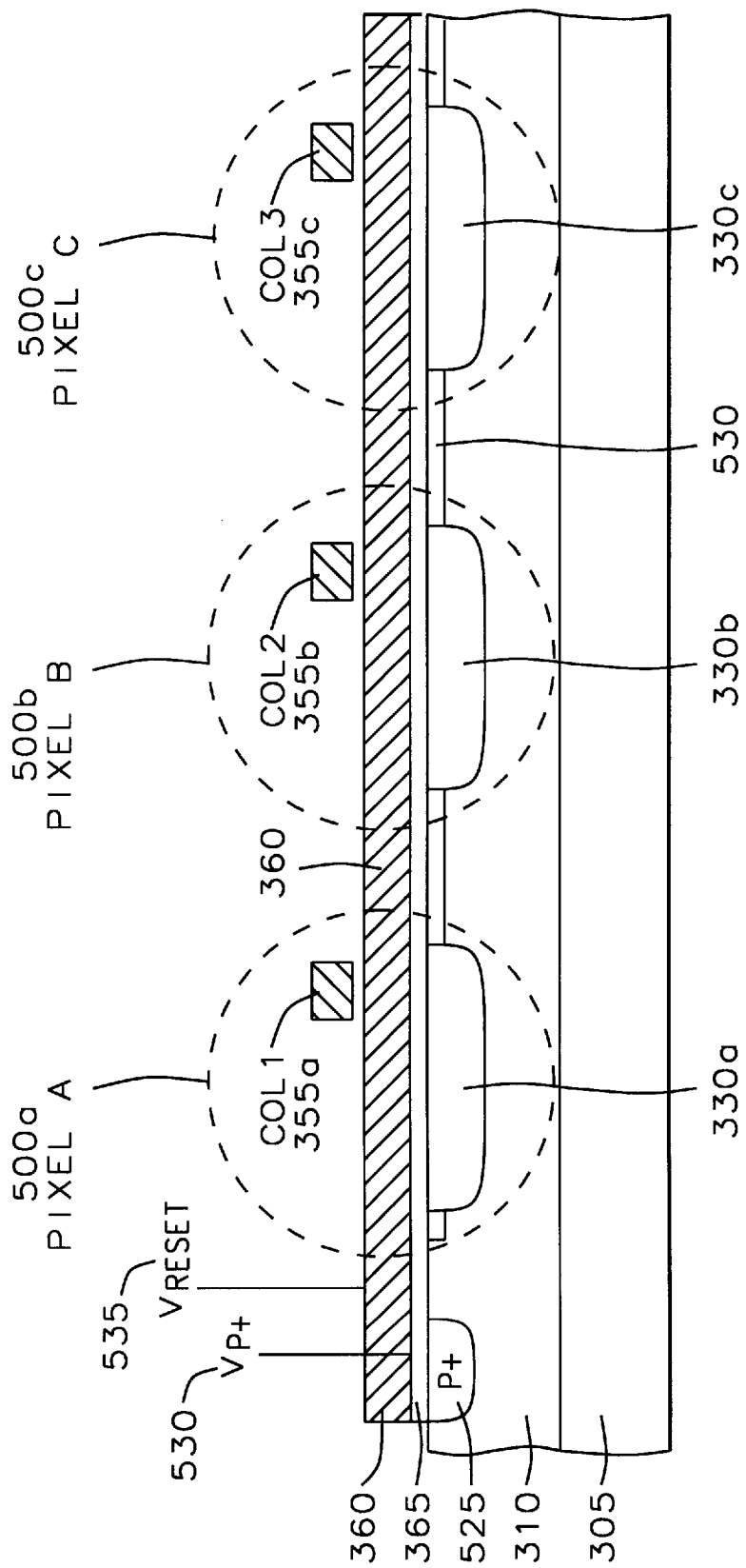
Figure 6C:
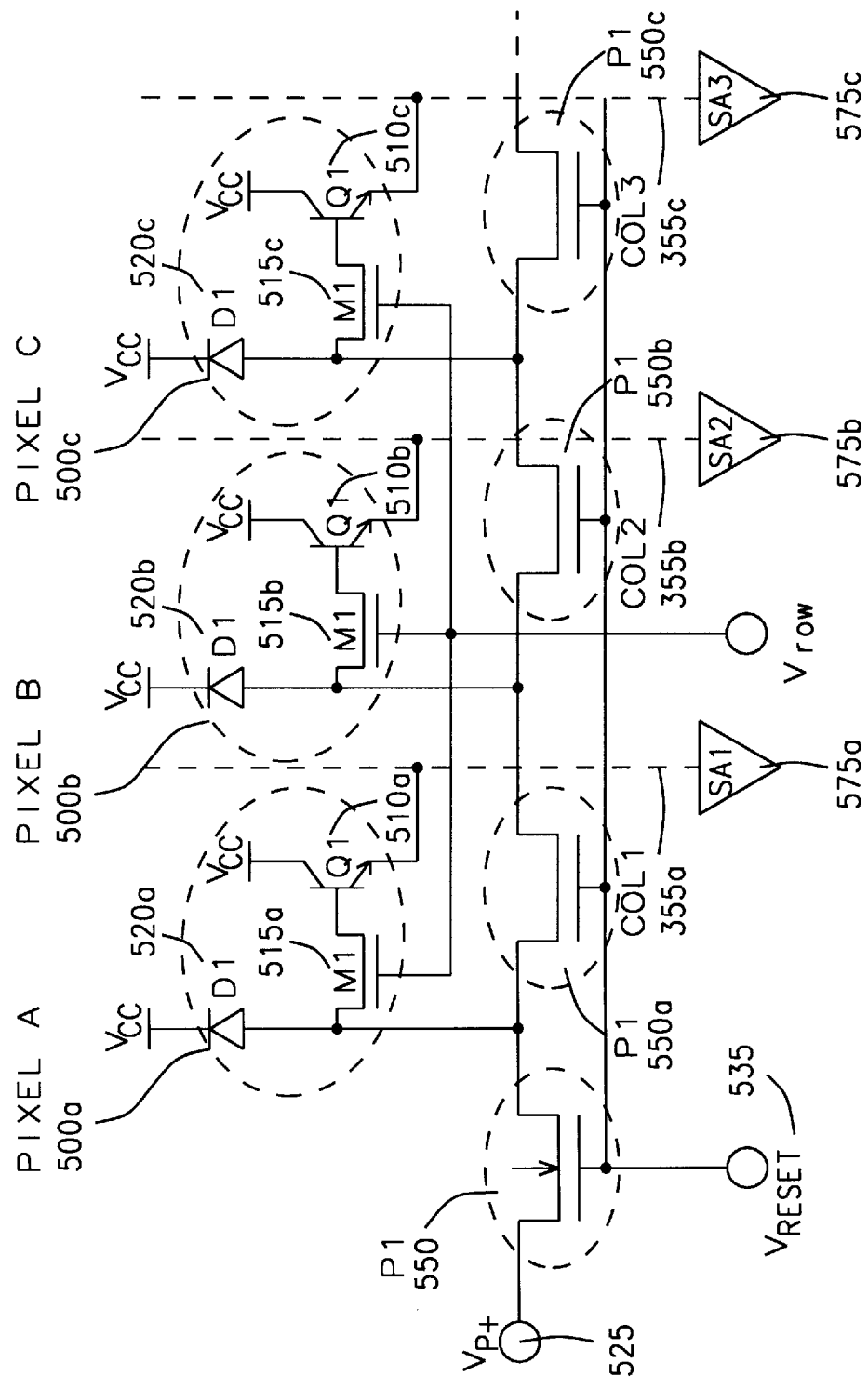
Figure 6B:
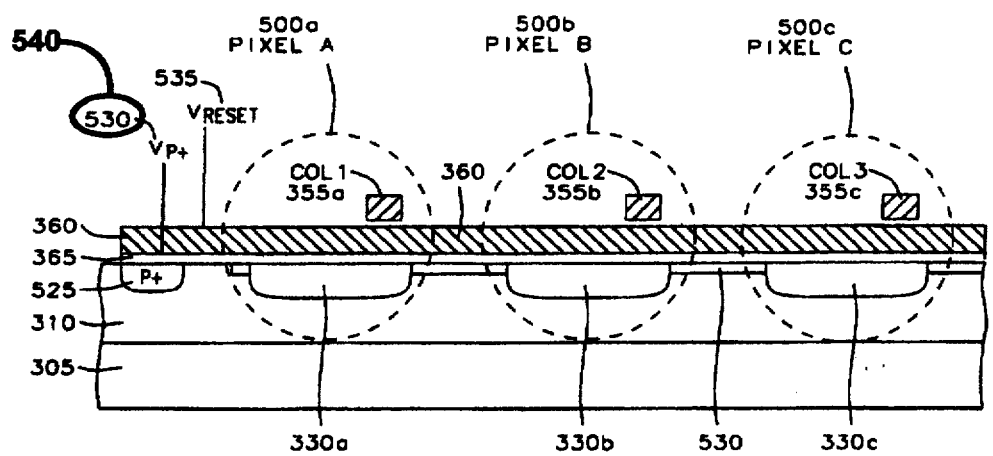
Figure 6C:
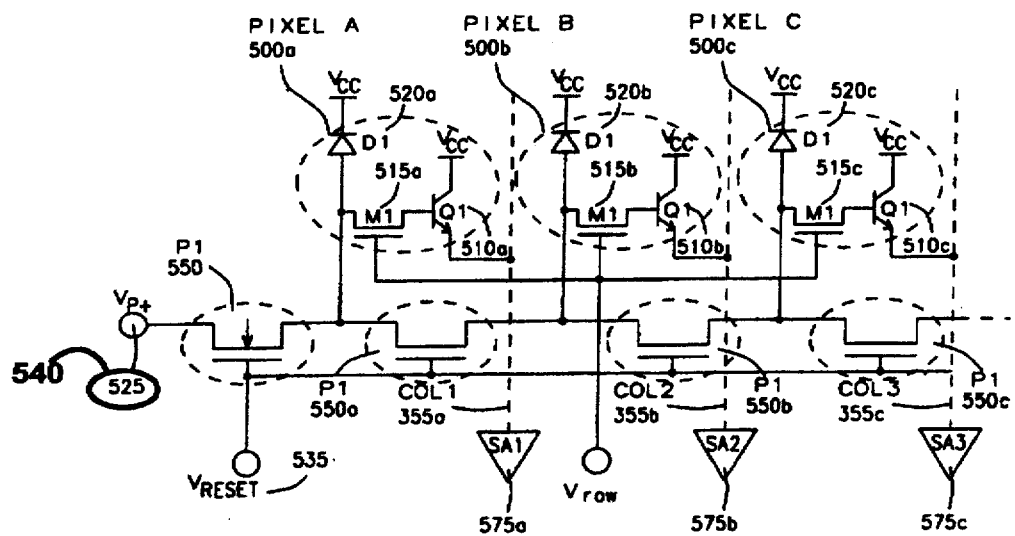

FIGS. 6a, 6b, and 6c show three active pixel sensors 500a, 500b, 600c on a row within an array of rows and columns of active pixel sensors. The gates 505a, 505b, 505c, of the P-MOS transistors M1 515a, 515b, 515c of each of the active pixel sensors 500a, 500b, 500c are connected by the common row polysilicon material 335 to the row activation circuit $V_{row}$. The reset polysilicon 360 is interconnected with all the reset 360 polysilicon layers of each active pixel sensor 500a, 500b, 500c and to the reset control circuit $V_{reset}$ 535. An edge junction 520 is formed by the implantation of a P-type material into the surface of the semiconductor substrate 305 at the end of a row of active pixel sensors 500a, 500b, 600c. The edge junction will be connected to a biasing voltage source $V_{p+}$ 330. The oxide 365 formed when the gate oxide is grown, will isolate the reset polysilicon layer 360 from the P-anodes 330a, 330b, 330c.

Each of the P-anodes 330a, 330b, 330c will form the drain/source for the parasitic P-MOS transistors P1 550a, 550b, and 550c, of each active pixel sensor 500a, 500b, 500c. When the reset circuit $V_{reset}$ 530 is biased to a low voltage level, each of the parasitic P-MOS transistors P1 550a, 550b, and 550c of each active pixel sensor 500a, 500b, 500c will be turned on and all the potentials of the P-anodes 330a, 330b, 330c will be reset to be the same as the edge junction 525 to the biasing voltage source $V_{p+}$ 530.

A $V_T$ implant 535 is optionally placed in the channel area of the parasitic MOS transistor P1 550 to define the threshold voltages $V_T$ of the parasitic MOS transistor P1 550 to desirable values. The implant will either be a N-type impurity or P-type impurity dependent on whether the parasitic MOS transistor P1 550 is to operate as an enhancement or a depletion MOS transistor.

The activation of the parasitic MOS transistor P1 550 will partially eliminate the image lag by resetting the potential of all P-anodes in a row to the same potential as the edge junction biased at the voltage source $V_{p+}$ 530 as described in the prior art.

Refer back to FIGS. 4c and 4d. During the read operation, the image charge $Q_s$ 494 will flow into the P-base as a base current and forward bias the P-base of the bipolar transistor Q1 410 and initiate bipolar action. The base current from the image charge $Q_s$ 494 will be amplified as described above to form the emitter current $I_{sc}$ 412, which will flow into the sense amplifier 425. The total charge collected by the sense amplifier 425 which is the amplified image charge $Q_s$ 494 will represent the amplitude of light L1 334 to impinge on the photodiode D1 420.

The area of the anode of the photodiode D1 420 is designed to be much larger than the base of bipolar transistor Q1 410. This will force the base of bipolar transistor Q1 410 to have a voltage that is the same as that of the anode of the photodiode D1 420. The injected minority carriers (electrons injected from the emitter) is confined to the base of the bipolar transistor Q1 410 and can not flow through the inverted P-channel MOS transistor and reach the anode of the photodiode D1 410. There will be little unrecombined charges left in the base of the bipolar transistors Q1 410. This combined with the above described reset operation will reduce the image lag to a negligible level.

While this invention has been particularly shown and described with reference to the preferred embodiments thereof, it will be understood by those skilled in the art that various changes in form and details may be made without departing from the spirit and scope of the invention. A corresponding pixel with a PNP bipolar transistor and an N-MOS transistor can be easily formed by reversing the polarities of the silicon materials implanted. The operation biases are also reversed appropriately.

The invention claimed is:

1. A method to fabricate on a semiconductor substrate having an impurity of a first conductivity of type, an active pixel sensor that will receive a quantum of light energy and convert said quantum to an electronic signal, comprising the steps of:

a) forming a well within said semiconductor substrate by masking areas of said semiconductor substrate and implanting an impurity second conductivity type into said semiconductor substrate;

b) defining an area for said active pixel sensor by growing an field oxide external to said area;

c) forming a photodiode within said well by masking said semiconductor substrate and implanting an impurity of the first conductivity type to form an anode of said photodiode, and whereby said well will be a cathode of said photodiode;

d) forming a bipolar transistor by:
      masking said semiconductor substrate and implanting the impurity of the first conductivity type to form a base,
      masking said semiconductor substrate and implanting the impurity of the second conductivity type to form an emitter, and
      whereby said bipolar transistor has collector that is said well; and;

e) forming a MOS transistor by:
      depositing a gate oxide in a channel region between the anode, which will be the drain of said MOS transistor, and the base, which will be source of said MOS transistor, and
      depositing a first polysilicon material to form a gate on said gate oxide.

2. The method of claim 1 whereby said gate is connected to a sensor control circuit to selectively activate and deactivate said MOS transistor to allow charges formed by the quantum of light impinging on said anode to flow to the base of the bipolar transistor.

3. The method of claim 1 whereby said anode is sufficiently larger than the base of the bipolar transistor so that residual minority carriers in said base will be confined to said base to reduce image lag.

4. The method of claim 3 wherein said gate of said parasitic MOS transistor is connected to a reset circuit that will provide a reset signal that will activate said parasitic MOS transistor to reset a potential at said anode to prevent image lag on said active pixel sensor.

5. The method of claim 1 further comprising the step of forming a parasitic MOS transistor by:

a) growing an insulating material to form a parasitic gate oxide for said parasitic MOS transistor;

b) depositing a second polysilicon material upon said parasitic gate oxide to form a gate of said parasitic MOS transistor; and c) whereby a drain of said parasitic MOS transistor is the anode of the photodiode and a source of said parasitic MOS transistor is the anode of the photodiode of adjacent active pixel sensor formed on said semiconductor substrate.

* * * * *

UNITED STATES PATENT AND TRADEMARK OFFICE
CERTIFICATE OF CORRECTION

PATENT NO. : 5,854,100
DATED : December 29, 1998
INVENTOR(S) : Min-Hwa Chi

It is certified that error appears in the above-identified patent and that said Letters Patent is hereby corrected as shown below:

Column 7,
Line 35, replace "$V_{p+}$ 330" with -- $V_{p+}$ 540 --
Line 41, replace "$V_{reset}$ 530" with -- $V_{reset}$ 535 --
Line 46, replace "$V_{p+}$ 530" with -- $V_{p+}$ 540 --
Line 58, replace "$V_{p+}$ 530" with -- $V_{p+}$ 540 --

Drawings,
Please substitute corrected drawing 6b with attached page
Please substitute corrected drawing 6c with attached page Signed and Sealed this Thirtieth Day of April, 2002

Attest:

Attesting Officer

JAMES E. ROGAN
Director of the United States Patent and Trademark Office